United States Patent
Lui et al.

(10) Patent No.: US 8,759,908 B2
(45) Date of Patent: Jun. 24, 2014

(54) TWO-DIMENSIONAL SHIELDED GATE TRANSISTOR DEVICE AND METHOD OF MANUFACTURE

(75) Inventors: Sik Lui, Sunnyvale, CA (US); Anup Bhalla, Santa Clara, CA (US); Daniel Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 178 days.

(21) Appl. No.: 13/286,733

(22) Filed: Nov. 1, 2011

(65) Prior Publication Data
US 2013/0105886 A1    May 2, 2013

(51) Int. Cl.
*H01L 29/78* (2006.01)
(52) U.S. Cl.
USPC .................. 257/330; 257/331; 257/E29.257; 438/270
(58) Field of Classification Search
None
See application file for complete search history.

(56) References Cited

U.S. PATENT DOCUMENTS 5,574,302 A * 11/1996 Wen et al. ............. 257/330
5,998,833 A    12/1999 Baliga

FOREIGN PATENT DOCUMENTS

JP    2005116985 A * 4/2005

OTHER PUBLICATIONS

JP2005_116985_English_Translation.*

* cited by examiner

*Primary Examiner* — Julio J. Maldonado
*Assistant Examiner* — Molly Reida
(74) *Attorney, Agent, or Firm* — Joshua D. Isenberg; JDI Patent

(57) ABSTRACT

A shielded gate transistor device may include one or more shield electrodes formed in a semiconductor substrate at a first level and one or more gate electrodes formed in the semiconductor substrate at a second level that is different from the first level. One or more portions of the one or more gate electrodes overlap one or more portions of the one or more shield electrodes. At least a portion of the gate electrodes is oriented non-parallel to the one or more shield electrodes. The shield electrodes are electrically insulated from the semiconductor substrate and the one or more gate electrodes are electrically insulated from the substrate and shield electrodes.

27 Claims, 13 Drawing Sheets

With oxide removed

With oxide

With oxide removed

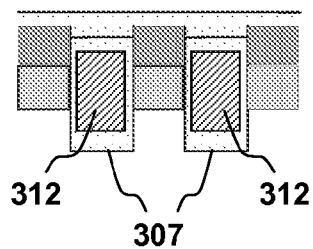 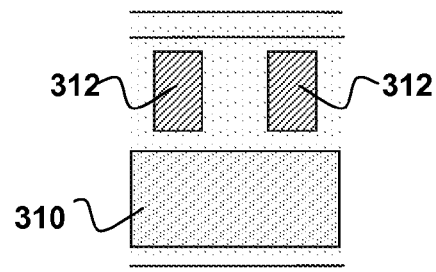
FIG. 3D    FIG. 3E
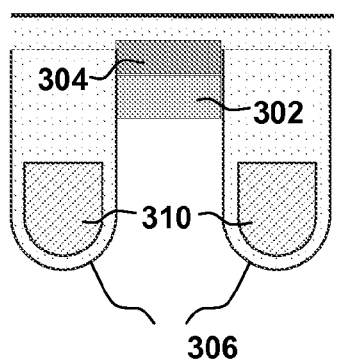 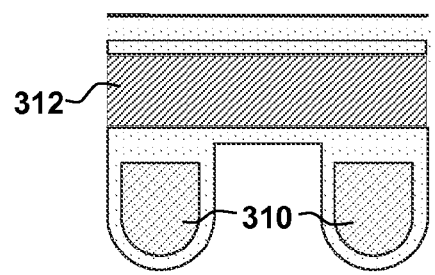
FIG. 3F    FIG. 3G

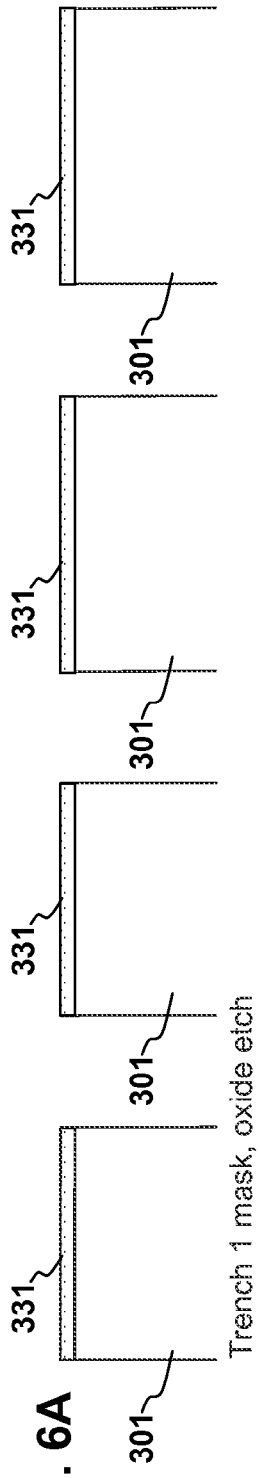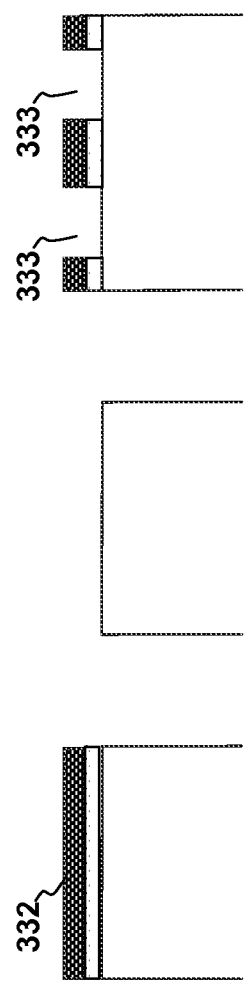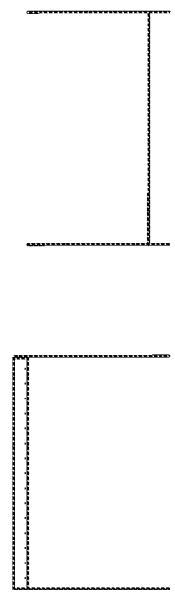

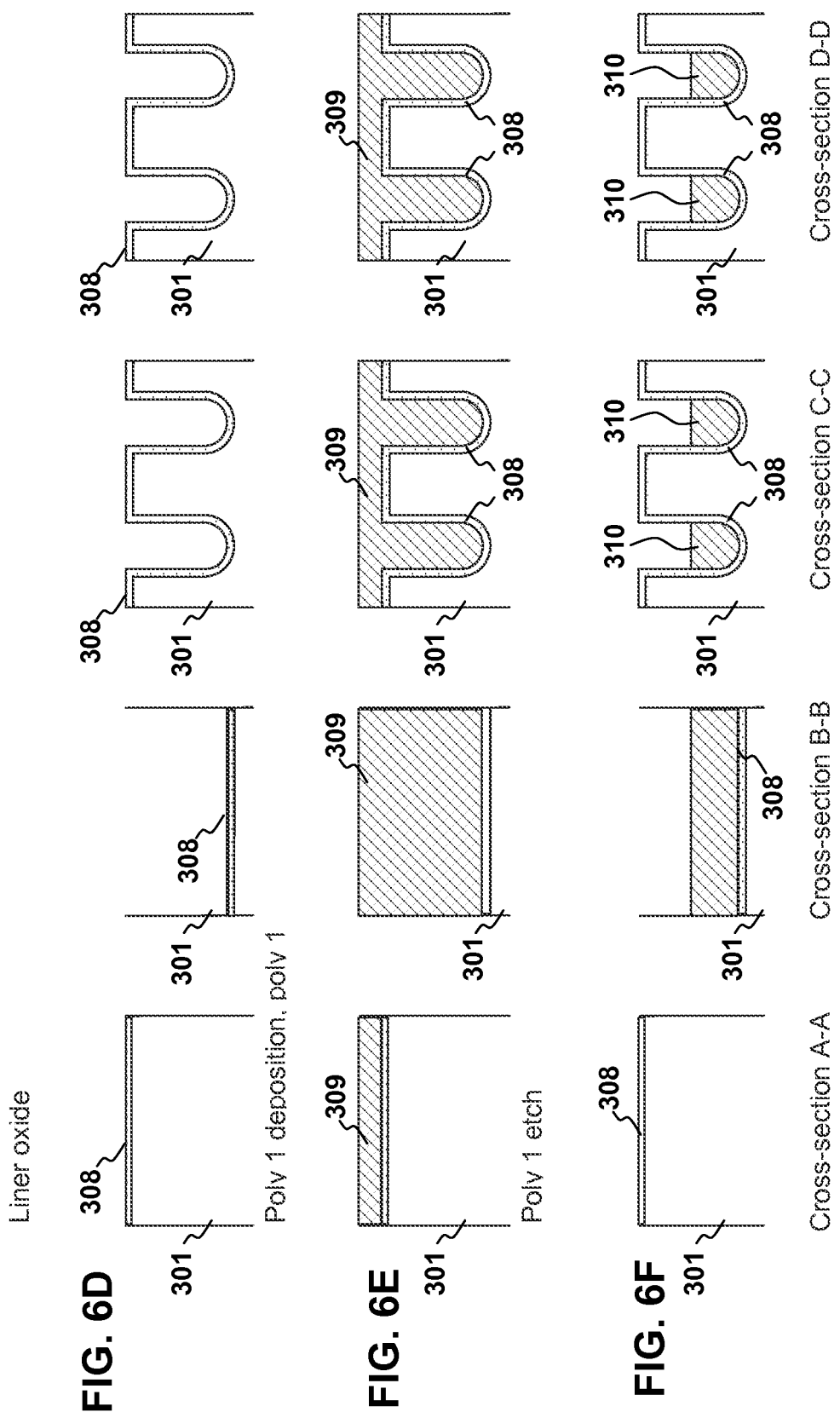

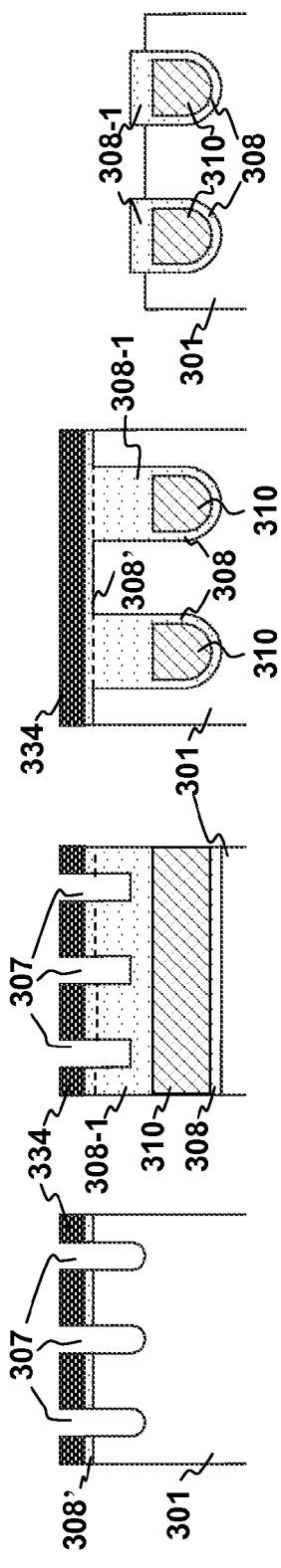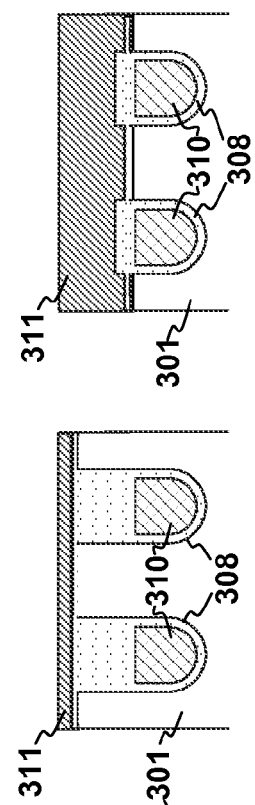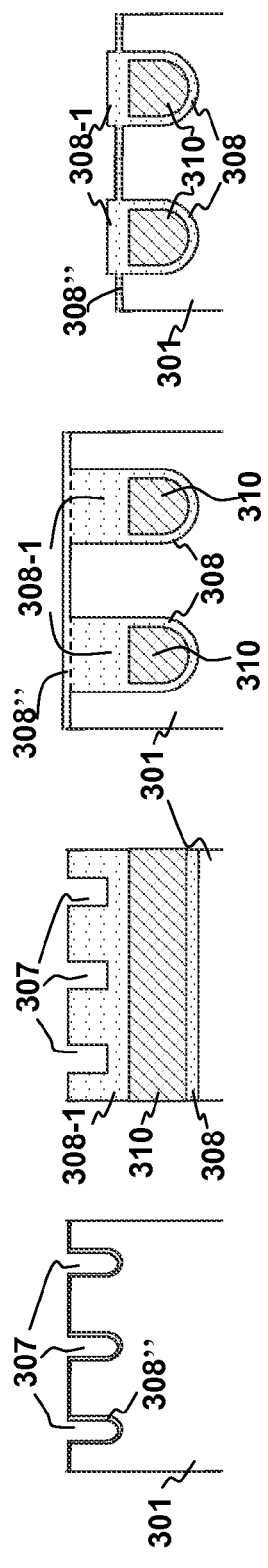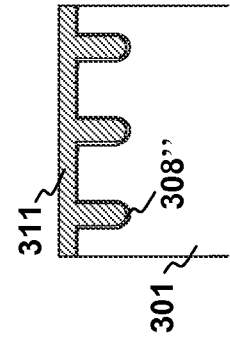
FIG. 6J Silicon trench etch
FIG. 6K Sacrificial oxidation, oxide etch, gate oxidation
FIG. 6L Poly 2 deposition

TWO-DIMENSIONAL SHIELDED GATE TRANSISTOR DEVICE AND METHOD OF MANUFACTURE

FIELD OF THE INVENTION

This invention relates in general to transistors and more particularly to shielded gate transistor devices and methods of manufacturing such devices.

BACKGROUND OF THE INVENTIONS

Shielded gate transistors are preferred for certain applications over conventional transistors, such as conventional trench MOSFETs (metal oxide semiconductor field effect transistors) because they provide several advantageous characteristics. Shielded gate trench transistors (SGTs) exhibit reduced gate-to-drain capacitance $C_{gd}$, reduced on-resistance $R_{DSon}$, and increased breakdown voltage of the transistor. For conventional trench MOSFETs, the placement of many trenches in a channel, while decreasing the on-resistance, also increased the overall gate-to-drain capacitance. The introduction of the shielded gate trench MOSFET structure remedies this issue by shielding the gate from the electric field in the drift region, thereby substantially reducing the gate-to-drain capacitance. The shielded gate trench MOSFET structure also provides the added benefit of higher impurity carrier concentration in the drift region for the device's breakdown voltage and hence lower on-resistance.

Shielded gate trench MOSFET devices are described, e.g., in U.S. Pat. No. 5,998,833 to Baliga.

The improved performance characteristics of the shielded gate trench MOSFET make the technology an excellent choice for power switching applications such as the switching converter commonly referred to as a synchronous buck converter (a type of DC-DC converter in which the output voltage is "stepped-down" compared to an input voltage). The shielded gate trench MOSFET is particularly suitable for the high-side switch in a synchronous buck converter. However, for the low-side switch which operates as a synchronous rectifier, excessive charge during the reverse recovery of the body diode results in increased power dissipation and reduced converter efficiency.

SGT with shielded gate at source potential has advantages of low $R_{DSon}$. The shield electrodes beneath the gate electrodes reduce gate-drain capacitance.

In a conventional SGT design, the shield electrodes and gate electrodes are formed in a self-aligned process that uses a single mask to form a set of trenches that are used for both the gate electrodes and the shield electrodes. However, the structural requirements of the shield electrodes and the gate electrodes are different. For example, because the shield electrode is at source potential, the shield electrode must be electrically insulated from the semiconductor layer in which the trench is formed. A thick oxide is typically used between epitaxial layer and the shield electrode to sustain breakdown. There is also a mesa between adjacent shield electrodes. When devices are scaled down problems can arise with the mesas getting too close together leaving insufficient room for the thick oxide.

It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIG. 3D is a cross-sectional schematic diagram taken along line A-A of FIG. 3A.

FIG. 3E is a cross-sectional schematic diagram taken along line B-B of FIG. 3A.

FIG. 3F is a cross-sectional schematic diagram taken along line C-C of FIG. 3A.

FIG. 3G is a cross-sectional schematic diagram taken along line D-D of FIG. 3A.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Introduction

Figure 1:
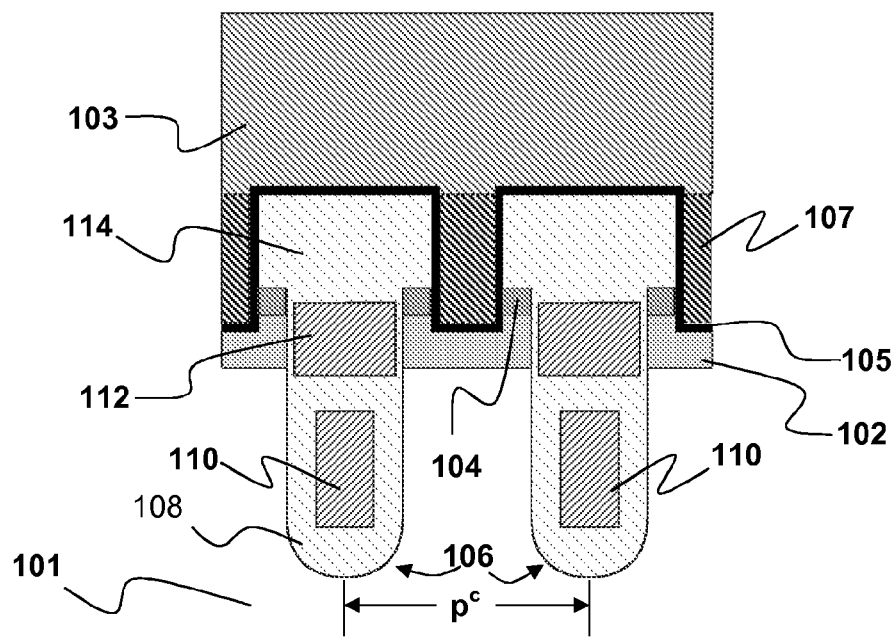
FIG. 1 is a cross-sectional schematic diagram of a shielded gate transistor of the prior art.

FIG. 1 illustrates a typical prior art shielded gate transistor device 100. The device 100 is generally formed on a semiconductor substrate 101, a lower portion of which is doped to act as a drain. A body region 102 doped opposite the drain is formed near a surface of the substrate 101. A source region 104 is formed in the body region 102 at or near the surface of the substrate. The source region is doped opposite the body region 102, but more heavily than the drain region. The source region 104 is electrically connected to a source metal 103, e.g., via a barrier metal 105 and a conductive plug 107.

Trenches 106 are formed in the substrate through the body region. The trenches 106 are lined with an insulating material 108, e.g., an oxide. A shield electrode 110 is formed in a lower portion of each trench 106. A gate electrode 112 is formed in an upper portion. The gate electrode is electrically insulated from the shield electrode 110 and the semiconductor substrate 101 by the insulating material 108 in the trench 106.

Another insulating material 114 electrically isolates the gate electrode from the source metal 103.

Prior art shielded gate transistors often fabricate the shield electrode 110 and the gate electrode 112 in the same trench. This simplifies manufacture since one set of trenches (and therefore one mask) can be used for fabrication of the shield and gate electrodes in a self-aligned process. Reducing the number of masks can significantly reduce the cost of manufacture.

It is desirable to reduce the source-drain resistance of the device 100 when it is in the "on" state. This resistance, referred to as $R_{DSon}$ can be reduced by reducing the cell pitch $p^c$. However, as the cell pitch shrinks problems can arise due to the differing insulating requirements for the shield electrode 110 and gate electrode 112. Specifically, the gate electrode 112 may be insulated by a relatively thin oxide on the sidewall of the trench 106. The shield electrode 110, by contrast, typically requires a thicker oxide for insulation because the shield electrode is held at source potential and the surrounding substrate 101 is at drain potential. The source-drain voltage difference is fixed for a given device. The insulating material 108 must be thick enough to prevent breakdown, which depends on electric field strength in the insulating material 108. The electric field strength depends directly on the voltage and inversely on the insulator thickness. The field at which breakdown occurs is generally a material property of the insulating material.

When cell pitch is reduced, the insulator thickness must be maintained. This involves reducing the width of the shield electrode 110. Below some value of the cell pitch, the shield electrode simply becomes too narrow to be manufactured. Unfortunately, if the shield and gate electrodes are formed using the same trench, the cell pitch is determined by the pitch of the trenches 106.

Figure 2:
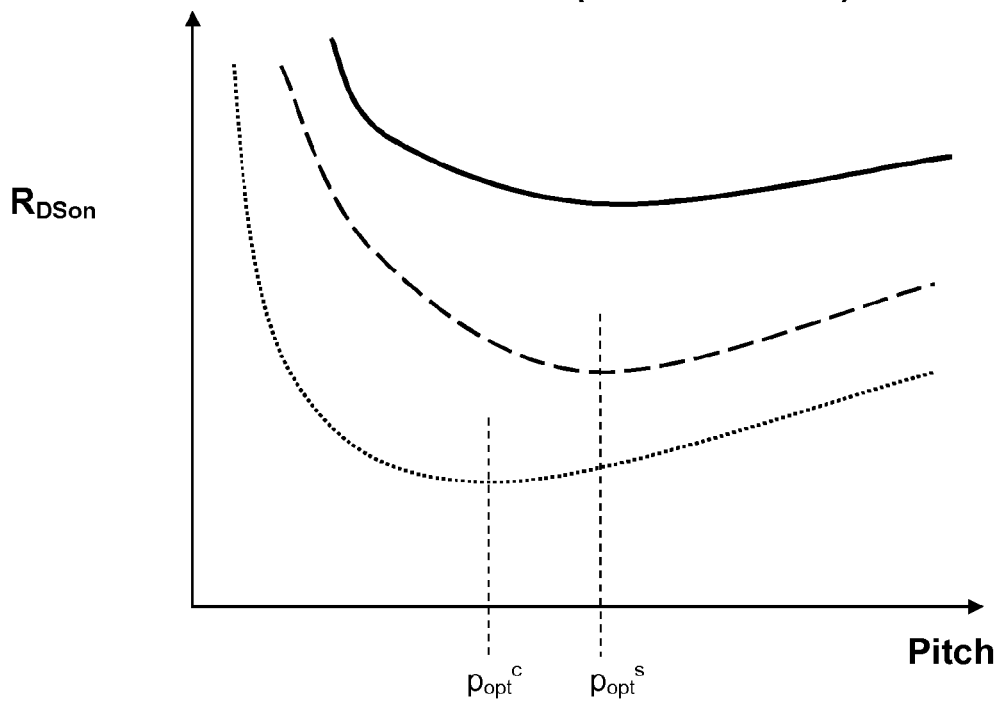
FIG. 2 is a graph of $R_{DSon}$ versus pitch for gate electrodes and shield electrodes.

The problem may be illustrated by FIG. 2, which graphically illustrates the trend of $R_{DSon}$ as a function of cell pitch. The dotted line shows the effect on $R_{DSon}$ versus pitch due to the cell structure independent of the shield electrode. The dashed line shows the effect of $R_{DSon}$ due to the shield electrode. The solid line shows the combined effect of the cell structure and the shield electrode. It is noted that there is an optimum pitch $p_{opt}^c$ for the cell structure alone and a different optimum pitch $p_{opt}^s$ for the shield. The design of the device 100 cannot be fully optimized for both cell pitch and shield pitch because the pitch for the shield is the same as the pitch for the cell.

Solution to the Problem

Embodiments of the present invention solve the aforementioned problems by de-coupling the shield electrode and gate electrode structures. Specifically, the shield and gate electrodes are formed at different levels in a non-parallel and overlapping fashion. This structure allows the pitch of the shield electrodes to be established independently of the cell pitch. For example, instead of forming the shield and gate electrodes in the same trench, the shield electrodes may be formed in a first set of trenches at a lower level and the gate electrodes may be formed in a second set of trenches at an upper level that overlaps the first set but is at least partly non-parallel to the first set. Alternatively, e.g., for a bottom source power device, a shielded gate transistor device according to an embodiment of the invention may have the gate electrode located proximate a bottom of the substrate and the shield electrode proximate the top of the substrate.

Although this technique uses separate masks to form the shield electrodes and gate electrodes, the pitch of the cells can be scaled without correspondingly scaling the pitch of the shield electrodes. Furthermore, the gate electrodes may be in the form of closed cells since they are de-coupled from shields.

Embodiments

FIGS. 3A-3G illustrate a portion of a shielded gate transistor device 300 according to an embodiment of the present invention. The device 300 is formed on a semiconductor substrate 301, which may be made of suitably doped silicon. A lower portion of the substrate 301 may be doped to provide a desired first conductivity type (e.g., N-type or P-type). The lower portion of the substrate 301 can act as a drain for the device 300. Similar to the device 100, a body portion 302 and source regions 304 are formed in upper portions of the substrate 301. The body portion 302 is doped with dopants that provide the body portion with a second conductivity type that is opposite to the first conductivity type of the lower portions. The source regions 304 are doped with dopants with the first conductivity type but more heavily doped than the lower portion of substrate 301. By way of example and not by way of limitation, the lower portions of the substrate 301 may be doped with N-type dopant, the body region 302 may be doped with P-type dopant and the source region 304 may be more heavily doped with N-type dopant.

One or more shield electrodes 310 are formed in the semiconductor substrate 301 at a first level. The shield electrodes 310 are electrically insulated from the semiconductor substrate, e.g., by an insulator material 308, such as an oxide or nitride, which may coat the walls of a set of shield trenches 306 in which the shield electrodes are formed. One or more gate electrodes 312 are formed in the semiconductor substrate 301 at a second level between the shield electrodes and a surface of the substrate. The gate electrodes 312 are electrically insulated from the semiconductor substrate 301 and from the one or more shield electrodes 310. By way of example, and not by way of limitation, the gate electrodes 312 may be formed in gate trenches 307, as seen in FIG. 3D. The walls of the gate trenches 307 may be lined with an insulator material, such as an oxide or nitride. The insulator material may be the same material as the insulator material 308 that coats the walls of the shield trenches 306. At least a portion of the gate electrodes 312 is oriented non-parallel to the shield electrodes 310 and one or more portions of the gate electrodes overlap one or more portions of the shield trenches.

Figure 3A:
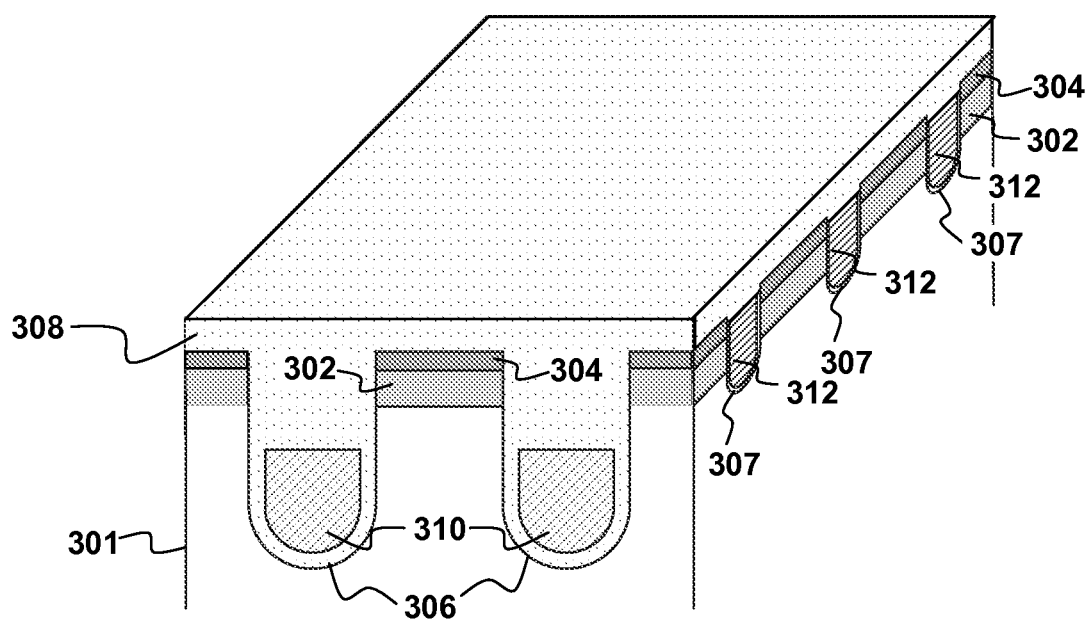
FIG. 3A is a three-dimensional view of a shielded gate transistor according to an embodiment of the present invention.
Figure 3B:
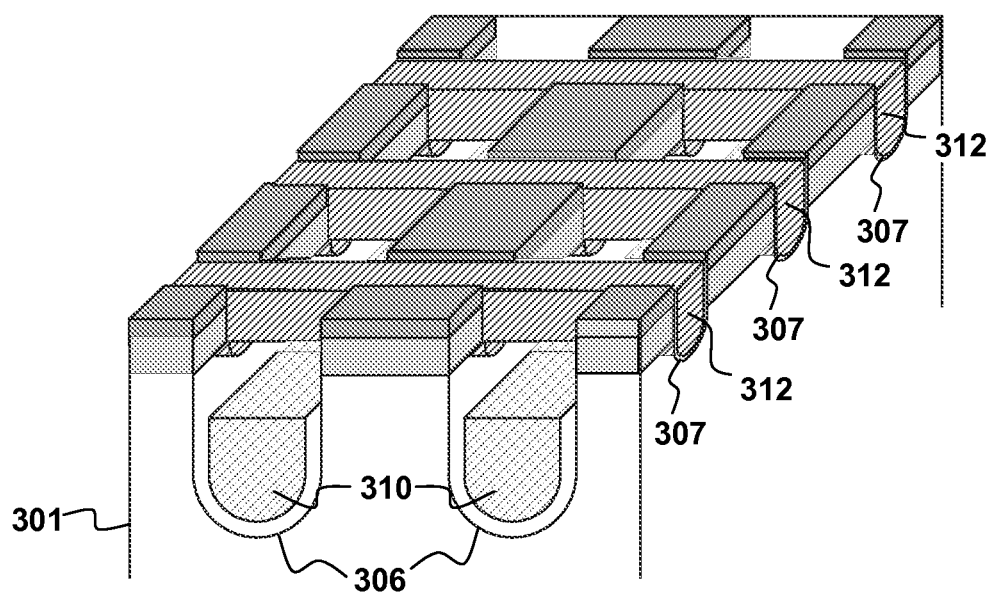
FIG. 3B is another three-dimensional view of the device of FIG. 3A in which part of the oxide has been removed.
Figure 3C:
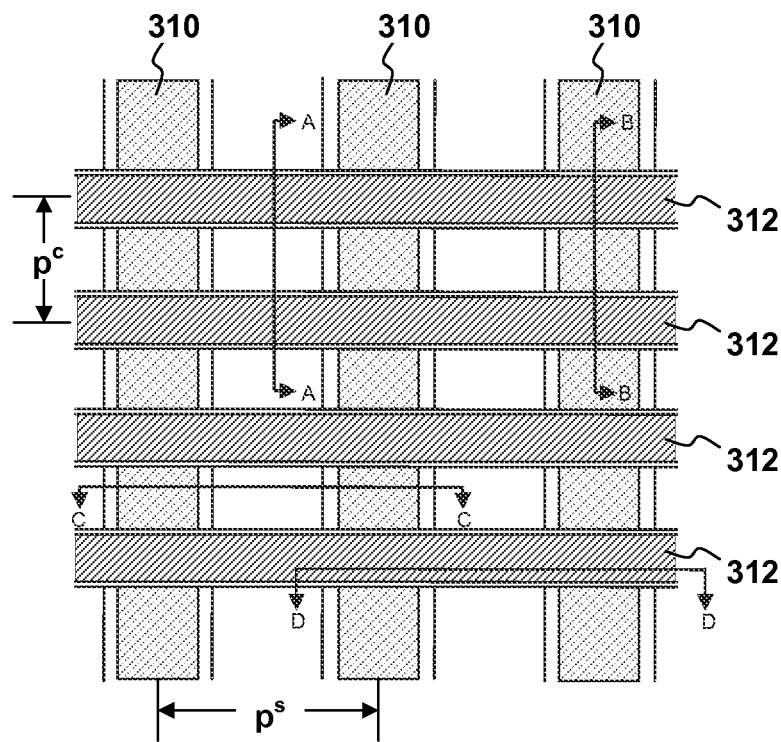
FIG. 3C is a top view schematic diagram of the shielded gate transistor of FIG. 3A and FIG. 3B.

By way of example, and not by way of limitation, the shield electrodes 310 may be oriented perpendicular to the gate electrodes 312, as shown in FIGS. 3A-3C. To assist in visualizing the structure of the gate and shield electrodes, the insulator material 308 has been removed in FIG. 3B to reveal the structure of the electrodes.

The device 300 is similar in construction to the device 100 of FIG. 1, except that portions of shield electrodes 310 and gate electrodes 312 overlap but are non-parallel to each other. In the example illustrated in FIGS. 3A-3G, the shield electrodes 310 and gate electrodes 312 are oriented perpendicular to each other. However, in alternative embodiments, the shield and gate electrodes may be non-perpendicular to each other as long as they are not parallel.

The structure of the device 300 allows a pitch $p^s$ of the shield electrodes to be different from a cell pitch $p^c$, which is the pitch of the gate electrodes. Furthermore, a width of the shield electrodes may be optimized independently of the width of the gate trenches 307 or the width of the gate electrodes 312. The design of the device 300 allows for independent scaling down of cell pitch and shield pitch. This is particularly useful in high voltage devices where the cell pitch is less than about 2.5 microns and in low voltage devices where the cell pitch is less than about 1 micron. Embodiments of the invention are particularly advantageous for cell pitch in a range between about 0.5 microns and about 1.0 micron.

Figure 4:
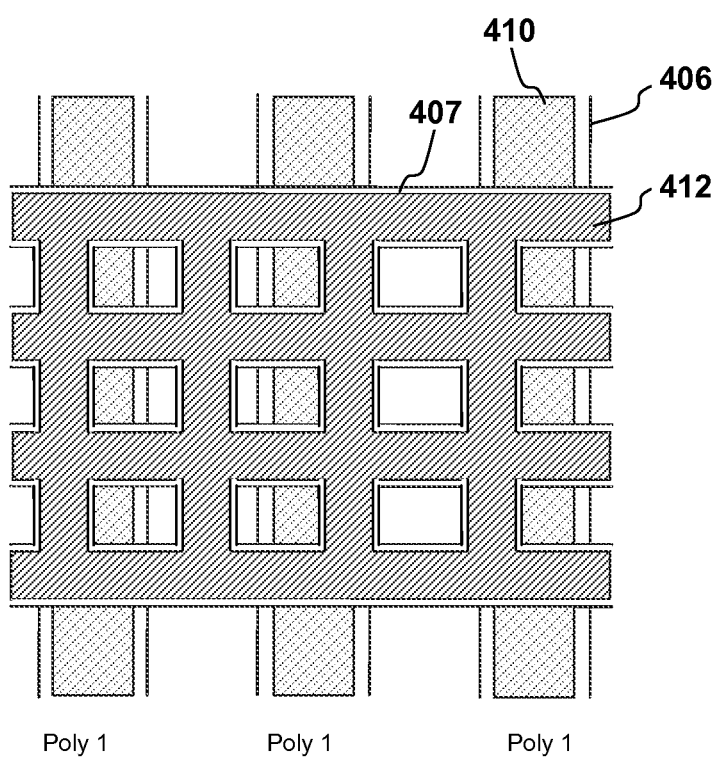
FIG. 4 is a top view schematic diagram of a shielded gate transistor having a closed cell structure according to an alternative embodiment of the present invention.

Embodiments of the present invention also allow independent scaling of cell pitch and shield pitch in closed cell shielded gate transistor devices. By way of example, as shown in FIG. 4, a series of closed cells may be formed by gate electrodes 412 having portions that are perpendicular to shield electrodes 410 that are formed in a semiconductor substrate at a lower level. The gate electrodes 412 also include portions that are parallel to the shield electrodes. The perpendicular and parallel portions of the gate electrodes form rectangular closed cells. As with the device 300, the shield electrodes may be formed in shield trenches 406 and the gate electrodes may be formed in suitably configured gate trenches 407. The gate electrodes and shield electrodes may be insulated from the semiconductor substrate and from each other, e.g., by an insulator material such as an oxide.

Figure 5:
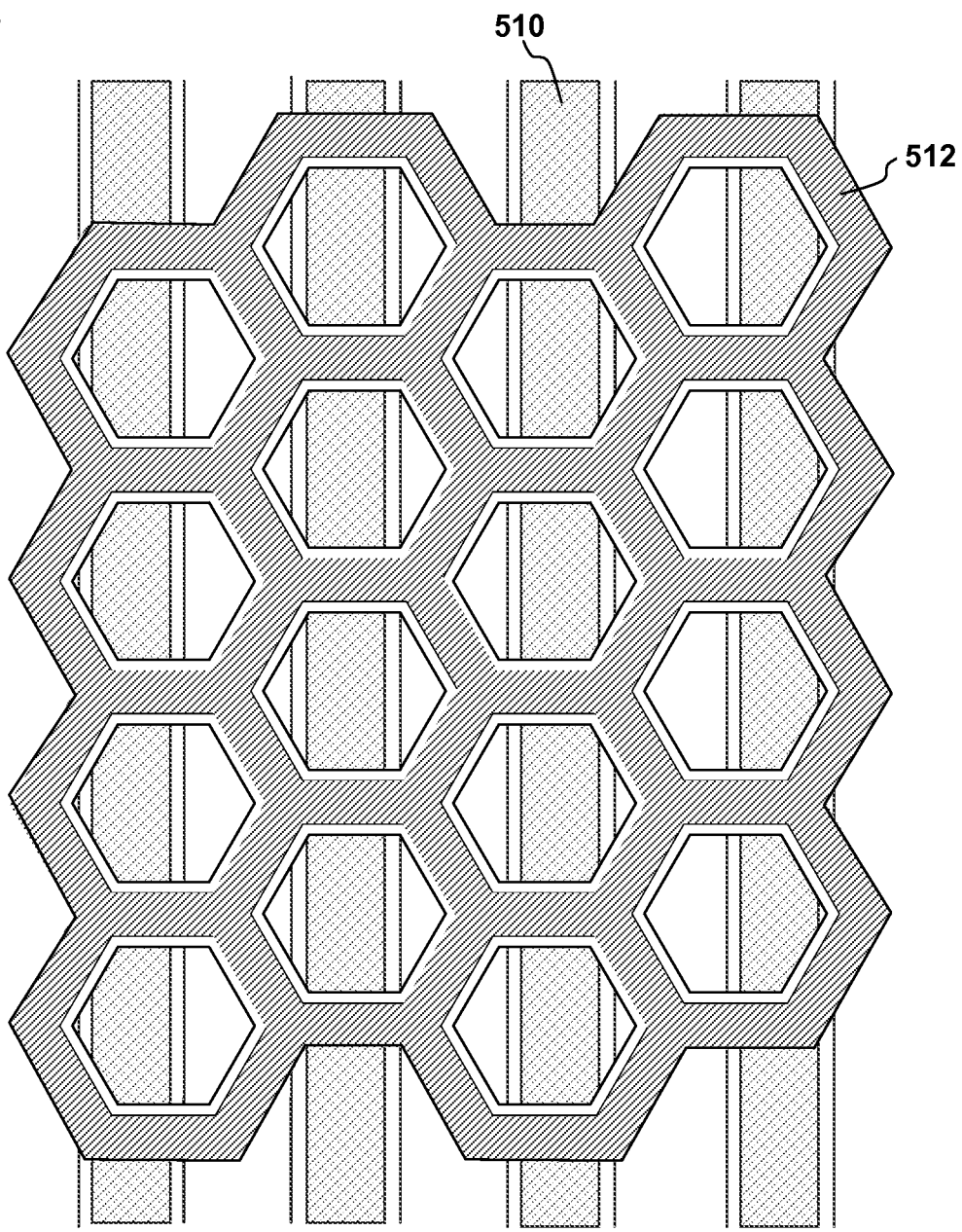
FIG. 5 is a top view schematic diagram of a shielded gate transistor having a different closed cell structure according to another alternative embodiment of the present invention

Although in the example shown in FIG. 4, the shield electrodes 410 are formed in parallel trenches 406 that are oriented perpendicular to portions of the gate trenches 407, the shield trenches and portions of the gate trenches may be non-perpendicular in other embodiments of the present invention. Furthermore according to other alternative embodiments, closed cell structures may be formed in non-rectangular shapes. For example, as, illustrated in FIG. 5, a shielded gate transistor device 500 may have gate electrodes 512 that form hexagonal closed cells in a honeycomb pattern that overlaps an underlying pattern of shield electrodes 510.

Embodiments of the present invention include methods for fabricating a shielded gate transistor device of the types described above. By way of example, and not by way of limitation, a shielded gate transistor device like the device 300 of FIGS. 3A-3G may be fabricated as depicted in FIGS. 6A-6P, which illustrate the fabrication at different stages and at different cross-sections corresponding to the cross-sections identified in FIG. 3C.

Figure 6G:
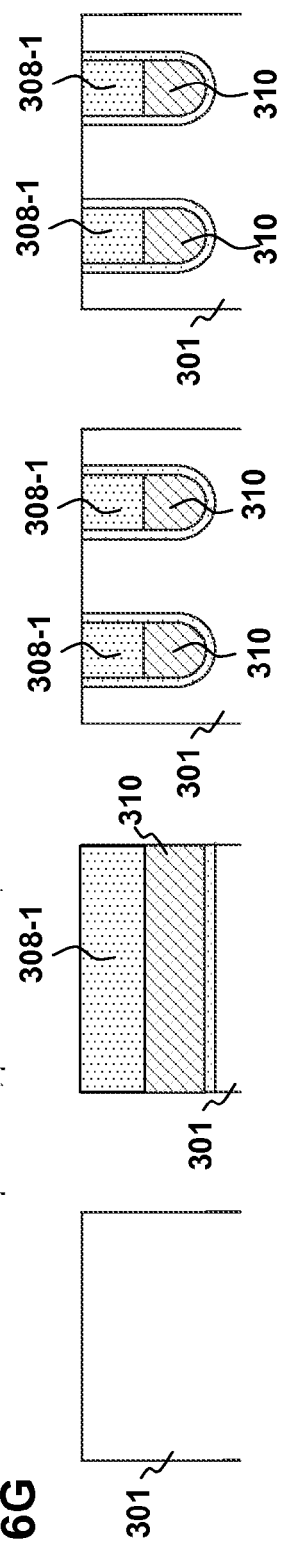
FIGS. 6A-6P is a sequence of cross-sectional schematic diagrams illustrating a method of fabrication of the device of FIGS. 3A-3G.

As seen in FIG. 6A, the process may begin by forming an initial layer of insulator, e.g., oxide 331, on the substrate 301. A photoresist 332 may be formed on the oxide 331 and then developed. The oxide 331 may be etched through openings 333 in the oxide 331 as shown in FIG. 6B. The trench mask 332 is removed and shield trenches 306 may then be etched in the semiconductor substrate 301 through the openings 333 in the oxide 331, as shown in FIG. 6C. As shown in FIG. 6D liner insulator 308 (e.g., another oxide) may then be formed on exposed portions of the substrate 301 including side and bottom walls of the shield trenches 306. Conductive material 309 (e.g., polysilicon) may then be formed covering the liner insulator 308 and filling the rest of the trenches 306 as shown in FIG. 6E. The conductive material 309 may be etched back, as shown in FIG. 6F, leaving portions in the bottoms of the shield trenches 306 that form the shield electrodes 310. Oxide deposition may then be carried out to fill up the remaining portions of the shield trenches 306 not occupied by the liner insulator 308 and gate electrodes 310 with insulator 308-1 (e.g., oxide) followed by the planarization, for example CMP, to remove oxide 308-1 on top surface of the substrate 301 as shown in FIG. 6G.

Figure 6H:
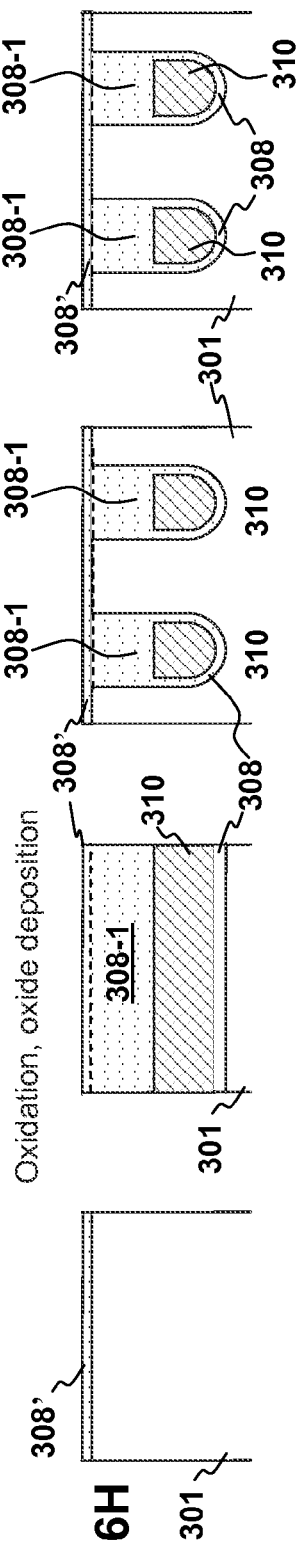
Figure 6I:
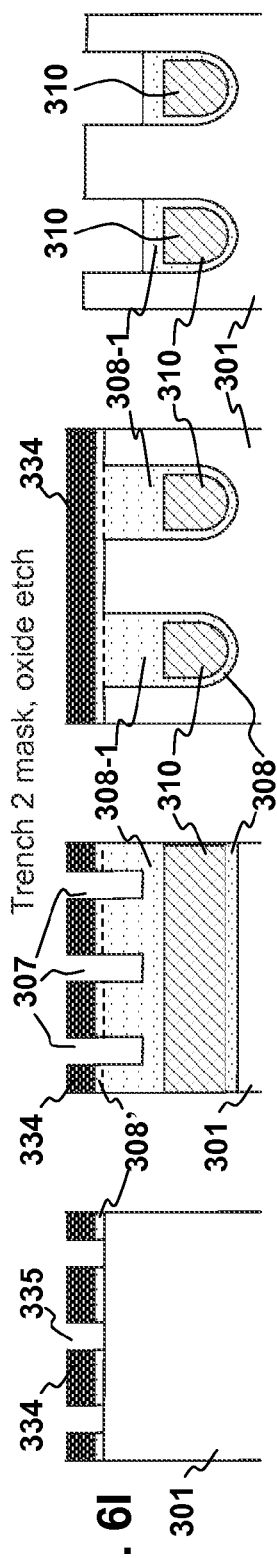

An additional insulator 308' (e.g., another oxide) may be deposited or otherwise formed to cover the surface of the semiconductor substrate 301 as shown in FIG. 6H. The additional insulator 308' on the surface of the substrate 301 may then be covered with a photoresist 334, which may be developed to produce a pattern of openings 335. The resist 334 may be patterned differently than the photoresist 332, e.g., using a different mask having a different trench pattern than that used to form the shield trenches 306. Portions of the additional insulator 308' and insulator 308-1 may be etched through the openings 335 as shown in FIG. 6I to form part of the gate trenches 307. The etch process may be one that etches the additional insulator 308' and insulator 308-1 but not the substrate 301. In a subsequent etch process, the substrate 301 may be etched through the openings 335 in the photoresist 334 and additional insulator 308' to form remaining portions of the gate trenches 307, as shown in FIG. 6J. After the photoresist 334 and the additional insulator 308' have been removed, sacrificial oxidation followed by an oxide etch may be carried out then a gate insulator 308" (e.g., a gate oxide) may be formed on the side and bottom walls of the gate trenches 307 and covering portions of the surface of the substrate 301 between the gate trenches as shown in FIG. 6K. A conductive material 311, e.g., polysilicon, may then be deposited or otherwise formed over the substrate 301, as shown in FIG. 6L, covering the surface of the substrate and filling the gate trenches 307.

Figure 6M:
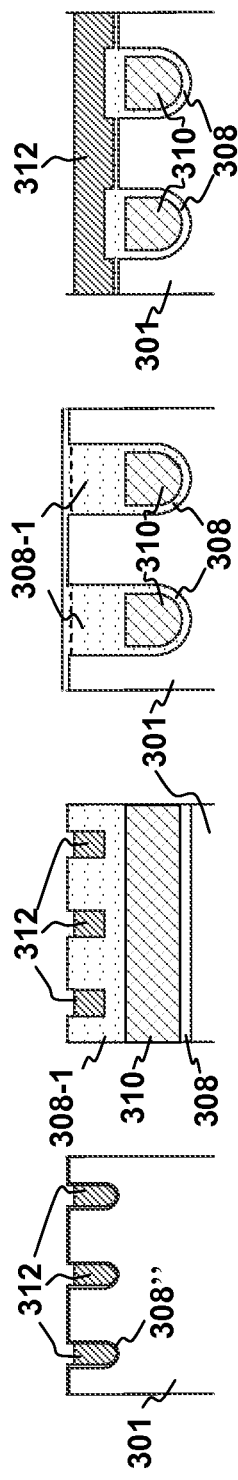
Figure 6N:
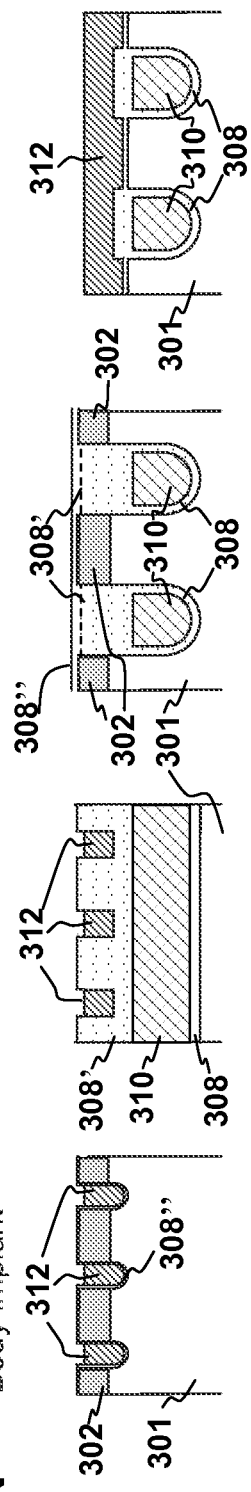
Figure 6O:
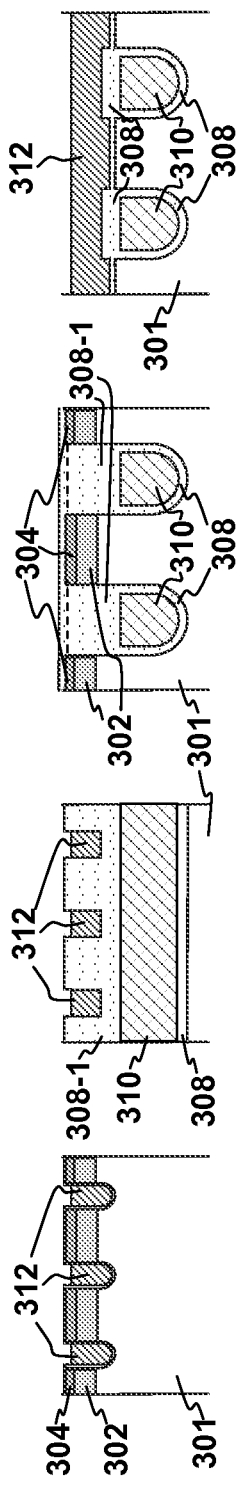
Figure 6P:
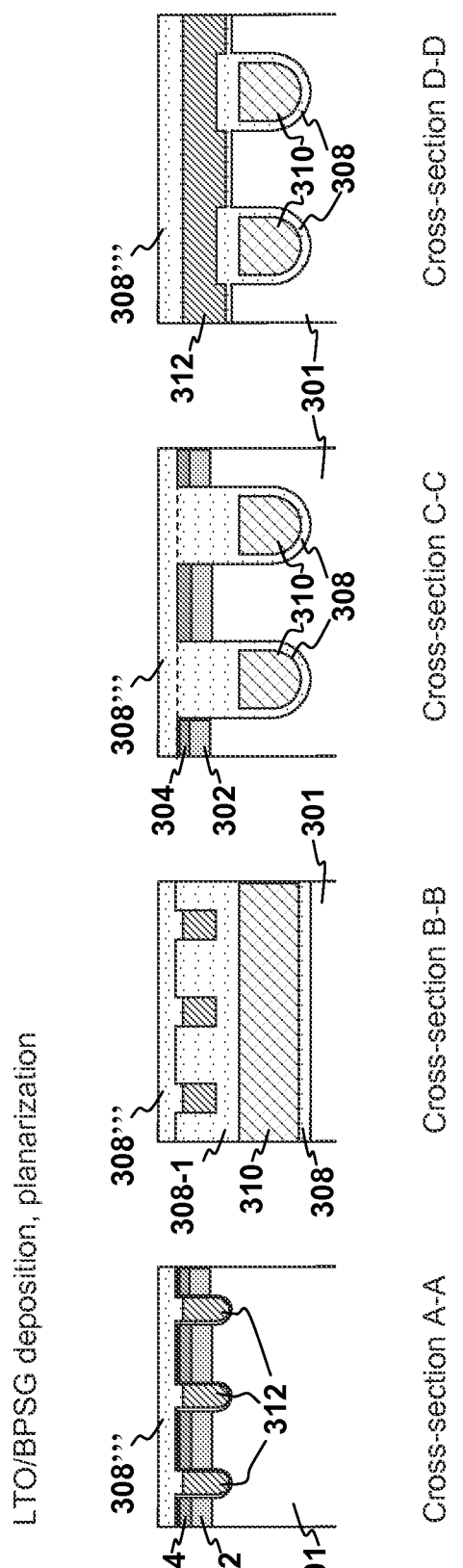

The conductive material 311 may be etched back leaving only portions in the gate trenches 307 that act as the gate electrodes 312, as shown in FIG. 6M. The insulator 308 provides the electrical insulation between the shield electrode 310 and the substrate 301, the insulator 308-1 provides electrical insulation between the gate electrodes 312 and the shield electrodes, and gate insulator 308" provides electrical insulation between the gate electrode and the substrate 301. As shown in FIG. 6N, suitable dopant ions may be implanted into the surface of the substrate 301 through the gate insulator 308" proximate the gate electrodes 312 to form the body regions 302. The source regions 304 may then be formed proximate the gate electrodes 312, e.g., by implanting appropriate dopant ions into the surface of the substrate 301, as shown in FIG. 6O.

A final insulator 308''' may then be deposited or otherwise formed to electrically insulate the gate electrodes 312. By way of example, and not by way of limitation, the final insulator 308''' may be a low temperature oxide or borophosphosilicate glass (BPSG).

Embodiments of the present invention allow for independent optimization of the cell pitch and shield electrode pitch when scaling down the cell pitch for shielded gate transistor devices. By independently optimizing the cell pitch and shield pitch, $R_{DSon}$ can be reduced without sacrificing device performance such as an increase in output capacitance.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A shielded gate transistor device, comprising:
a semiconductor substrate;
one or more shield electrodes formed in the semiconductor substrate at a first level, wherein the one or more shield electrodes are electrically insulated from the semiconductor substrate;
one or more gate electrodes formed in the semiconductor substrate at a second level that is different from the first level, wherein the one or more gate electrodes are electrically insulated from the semiconductor substrate and the one or more shield electrodes, wherein at least a portion of the one or more gate electrodes is oriented non-parallel to the one or more shield electrodes, wherein one or more portions of the one or more gate electrodes overlap one or more portions of the one or more shield trenches.

2. The device of claim 1, wherein the second level is between the one or more shield electrodes and a surface of the semiconductor substrate.

3. The device of claim 1, wherein a pitch of the one or more shield electrodes is different from a pitch of the one or more gate electrodes.

4. The device of claim 1, wherein a width of the one or more shield electrodes is different from a width of the one or more gate electrodes.

5. The device of claim 4, wherein a pitch of the one or more shield electrodes is different from a pitch of the one or more gate electrodes.

6. The device of claim 1, wherein a pitch of the one or more gate electrodes is less than about 2.5 microns.

7. The device of claim 1, wherein a pitch of the one or more gate electrodes is less than about 1 micron.

8. The device of claim 1, wherein at least a portion of the one or more gate electrodes is oriented perpendicular to the one or more shield electrodes.

9. The device of claim 1, wherein at least a portion of the one or more gate electrodes is oriented non-perpendicular to the one or more shield electrodes.

10. The device of claim 1, wherein the one or more gate electrodes include one or more closed cell electrodes.

11. The device of claim 10, wherein the one or more closed cell electrodes include one or more honeycomb closed cell structures.

12. The device of claim 1, wherein the semiconductor substrate includes a drain region of a first conductivity type, the semiconductor substrate further including a body region proximate the one or more gate electrodes, wherein the body region is of a second conductivity type that is opposite the first conductivity type.

13. The device of claim 12, wherein the semiconductor substrate includes a source region proximate the one or more gate electrodes, wherein the source region is of the first conductivity type with a doping concentration higher than that of the drain region, wherein the body region is disposed between the source region and the drain region.

14. The device of claim 13, wherein the first conductivity type is N-type and the second conductivity type is P-type.

15. A method for fabricating a shielded gate transistor device, the method comprising:
a) forming one or more shield electrodes in a semiconductor substrate at a first level, wherein the one or more shield electrodes electrically insulated from the semiconductor substrate;
b) forming one or more gate electrodes in the semiconductor substrate at a second level other than the first level, wherein the one or more gate electrodes are electrically insulated from the semiconductor substrate and the one or more shield electrodes, wherein at least a portion of the one or more gate electrodes is oriented non-parallel to the one or more shield electrodes, wherein one or more portions of the one or more gate electrodes overlap one or more portions of the one or more shield trenches.

16. The method of claim 15, wherein forming the one or more gate electrodes includes forming one or more gate trenches in the semiconductor substrate and forming the one or more gate electrodes in the one or more gate trenches, wherein one or more portions of the one or more gate trenches are oriented non-parallel to the one or more shield electrodes, wherein one or more portions of the one or more gate trenches overlap the one or more shield electrodes.

17. The method of claim 15, wherein the one or more gate electrodes are formed at a level between the one or more shield electrodes and a surface of the semiconductor substrate.

18. The method of claim 15, wherein forming the one or more shield electrodes includes forming one or more shield trenches in a semiconductor substrate; and
forming the one or more shield electrodes in the one or more shield trenches.

19. The method of claim 18, wherein forming the one or more gate electrodes includes forming one or more gate trenches in the semiconductor substrate at a level between the one or more shield electrodes and a surface of the semiconductor substrate, and forming one or more gate electrodes in the one or more gate trenches, wherein the one or more gate trenches are oriented non-parallel to the one or more shield trenches, wherein one or more portions of the one or more gate trenches overlap the one or more shield trenches.

20. The method of claim 19, wherein a pitch of the one or more shield trenches is different from a pitch of the one or more gate trenches.

21. The method of claim 19, wherein forming the one or more gate trenches includes forming at least a portion of the one or more gate trenches oriented perpendicular to the one or more shield trenches.

22. The method of claim 19, wherein forming the one or more gate trenches includes forming at least a portion of the one or more gate trenches oriented non-perpendicular to the one or more shield trenches.

23. The method of claim 19, wherein forming the one or more gate trenches includes forming one or more closed cell trenches.

24. The method of claim 23, wherein the one or more closed cell trenches include one or more honeycomb closed cell structures.

25. The method of claim 15, wherein the semiconductor substrate includes a drain region of a first conductivity type, the method further comprising forming a body region in the semiconductor substrate proximate the one or more gate electrodes, wherein the body region is of a second conductivity type that is opposite the first conductivity type.

26. The method of claim 25, further comprising forming a source region in the semiconductor substrate proximate the one or more gate electrodes, wherein the source region is of the first conductivity type with a doping concentration higher than that of the drain region, wherein the body region is disposed between the source region and the drain region.

27. The method of claim 15, wherein forming one or more shield trenches includes etching the semiconductor substrate using a first mask having a first trench pattern and wherein forming the one or more gate trenches includes using a second mask having a second trench pattern that is different from the first trench pattern.

* * * * *